(12) United States Patent  
Herman

(10) Patent No.: US 6,346,726 B1
(45) Date of Patent: Feb. 12, 2002

(54) LOW VOLTAGE MOSFET POWER DEVICE HAVING A MINIMUM FIGURE OF MERIT

(75) Inventor: Thomas Herman, Manhattan Beach, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/436,302

(22) Filed: Nov. 8, 1999

Related U.S. Application Data

(60) Provisional application No. 60/107,700, filed on Nov. 9, 1998.

(51) Int. Cl.[7] .......................... H01L 29/76; H01L 29/94; H01L 31/062; H01L 31/113; H01L 31/119
(52) U.S. Cl. .................... 257/327; 257/328; 257/365; 257/408; 257/343
(58) Field of Search ................. 257/327, 328, 257/329, 365, 344, 408, 343

(56) References Cited

U.S. PATENT DOCUMENTS

| 5,541,429 A | * | 7/1996 | Shibib | 257/329 |
| 5,616,945 A | * | 4/1997 | Williams | 257/365 |
| 5,703,389 A | * | 12/1997 | Knoch | 257/327 |
| 5,795,793 A | * | 8/1998 | Kinzer | 437/41 |
| 5,960,275 A | * | 9/1999 | So et al. | 438/211 |
| 5,990,518 A | * | 11/1999 | Kobayashi et al. | 257/341 |
| 6,031,702 A | * | 2/2000 | Williams | 361/87 |
| 6,049,104 A | * | 4/2000 | Hshieh et al. | 257/328 |

* cited by examiner

Primary Examiner—Eddie Lee
Assistant Examiner—Jesse A. Femy
(74) Attorney, Agent, or Firm—Ostrolenk, Faber, Gerb & Soffen, LLP

(57) ABSTRACT

A power MOSFET die with a minimized figure of merit has of a planar stripe MOSFET geometry in which parallel diffused bases (or channels) are formed by implantation and diffusion of impurities through parallel elongated and spaced polysilicon stripes wherein the polysilicon line width is from about 3.2 to 3.4 microns, preferably 3.4 microns; the polyline spacing is from about 1 to 4 microns, preferably 1.5 microns and the diffused bases are spaced by greater than about 0.8 microns. The polysilicon stripes act as masks to the sequential formation of first base stripes, the source stripes and second higher concentration base stripes which are deeper than the first base stripes. Insulation side wall spacers are used to define a contact etch for the source contact. The above design geometry is used for both the forward control MOSFET and the synchronous rectifier MOSFET of a buck converter circuit.

12 Claims, 6 Drawing Sheets

US 6,346,726 B1

LOW VOLTAGE MOSFET POWER DEVICE HAVING A MINIMUM FIGURE OF MERIT

RELATED APPLICATIONS

This application claims the benefit of U.S. Provisional Application No. 60/107,700, filed Nov. 9, 1998.

This application is related to application Ser. No. 08/946,984 filed Oct. 8, 1997 entitled PROCESS FOR MANUFACTURE OF P CHANNEL MOSGATED DEVICE WITH BASE IMPLANT THROUGH CONTACT WINDOW (IR-1212); application Ser. No. 08/956,062 filed Oct. 22, 1997 entitled ZERO ALIGNMENT CELL PROCESS (20 MILLION/IN2) (GEN VI) (IR-1232); U.S. Pat. No. 5,795,793 issued Aug. 18, 1998 entitled NEW REDUCED MASK COUNT PROCESS (GEN 6-N CHANNEL) (IR-1113); application Ser. No. 09/038,453 filed Mar. 11, 1998 entitled MOS FETs FOR VERY LOW VOLTAGE D-C TO D-C CONVERTERS (IR-1455); all of which are owned by the assignee of the present application.

BACKGROUND OF THE INVENTION

This invention relates to MOSgated power devices and more specifically relates to a novel MOSgated device having a minimum figure of merit, a novel process for its manufacture, and a novel circuit application of the device.

Low voltage power MOSgated devices, particularly power MOSFETs, are well known and are commonly made with planar or trench topologies. The trench topologies have been used for very low voltage devices which are to have the lowest possible switching losses in high frequency applications such as in d-c to d-c converters used for producing a regulated d-c voltage for portable electronic devices powered from a battery. By reducing switching loss, battery life can be extended for such portables as lap top computers.

Switching loss is determined, in part, by the figure of merit of the MOSFET, which is the product of its on-resistance $R_{DSON}$ and its gate charge $Q_g$. A minimum figure of merit is desired for high frequency, low voltage MOSFETs. Trench devices have been useful in these applications because it was believed that they had an inherently lower $Q_g$ than that of planar designs.

Planar technology MOSFETs using spaced closed polygonal cells are well known, and are shown, for example, in U.S. Pat. No. 5,008,725, and in FIG. 12 herein. These devices have a relative lower on-resistance $R_{DSON}$ than equivalent trench designs, but, because of the geometry of the polygonal design (usually hexagonal or rectangular base cells) the polysilicon gate extends across areas such as areas 30, shown in FIG. 12 for a hexagonal cell topology, which do not contribute to invertible channel width. More specifically, FIG. 12 shows polysilicon web 31 containing windows 32, 33, 34 and 35 used to define diffused bases or channels, shown in dotted lines. The window openings such as opening 36 was conventionally 5.8 microns in low voltage designs. The polysilicon 31 overlies areas 30, which are inactive, contribute heavily to the polysilicon gate to-drain capacitance, and thus to $Q_g$.

Planar designs have also used a stripe topology, using elongated, spaced base stripes. While these designs have a lower $Q_{GD}$ than cellular designs, they usually have an increased on-resistance, and the figure of merit was not believed to be reduced by the planar stripe design.

It would be desirable to use a planar stripe topology for a low voltage power MOSgated device in which the figure of merit, that is, the product of $Q_G$ and $R_{DSON}$ can be reduced.

BRIEF SUMMARY OF THE INVENTION

In accordance with the invention, it has been found that a topology, employing parallel base stripes with a polysilicon line spacing between less than about 1.5 microns to about 2.5 microns, with a polysilicon line width of about 2.6 to about 8.0 microns, depending on the drain to source voltage rating. For a 30 volt device, it would be from 3.2 to 3.5 microns, preferably 3.4 microns. A base to base spacing of about 0.8 microns or greater will produce a minimum figure of merit. It has been found that the increased channel width per unit area produced by the closer spacing of the polysilicon lines reduces $R_{DSON}$ proportionally more than $Q_g$ increases, with a practical minimum figure of merit being reached at a polyline spacing of about 1.5 microns. The figure of merit obtained with this novel geometry is lower than that obtained with equivalent die areas employing either trench technology or closed polygonal cell technology.

Further, the present invention produces a device having both an extremely low $R_{DSON}$ and an extremely high avalanche energy.

Another feature of the invention employs the polysilicon stripes to define a mask for the formation of three sequential regions, the first being a base (or channel) diffusion, the second being a source diffusion and the third being a higher concentration base region which underlies the first base and which does not invade the invertible channel formed by the first base and source. The third region is formed by an implant through the polysilicon window and a subsequent anneal.

A novel application of the invention is for d-c to d-c converter circuits using a control MOSFET and a synchronous rectifier MOSFET. Both of these MOSFETs are made by the process of the invention and differ only in die area.

DETAILED DESCRIPTION OF THE DRAWINGS

Figure 1:
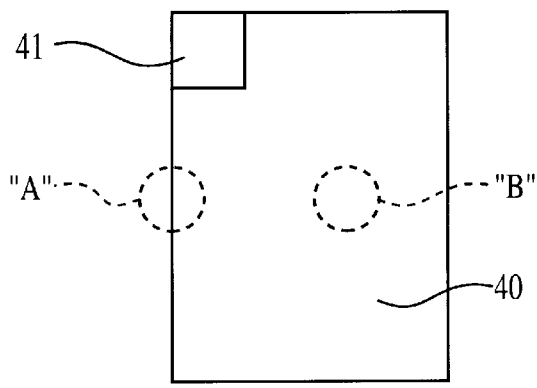
FIG. 1 is a top view of a die which can contain the structure of the present invention.

Referring first to FIG. 1, there is shown a typical die 40 which can be processed in accordance with the invention to produce a MOSgated device, for example, a power MOSFET. While the invention is applicable to all voltage ranges, it is particularly useful for devices having a breakdown voltage less than about 60 volts. Die 40 may have top source contact, a gate pad 41 for connection to its polysilicon gate, and a bottom drain contact, as will be described. A silicon wafer is formed with identical die which are simultaneously processed in a silicon wafer and are separated at the end of the process. The terms die, chip and wafer are frequently interchanged. Die 40 may be as large as about 102 mils by 157 mils which is the largest size which can be mounted in a typical SO8 package. Of course any other package can be used.

Figure 2:
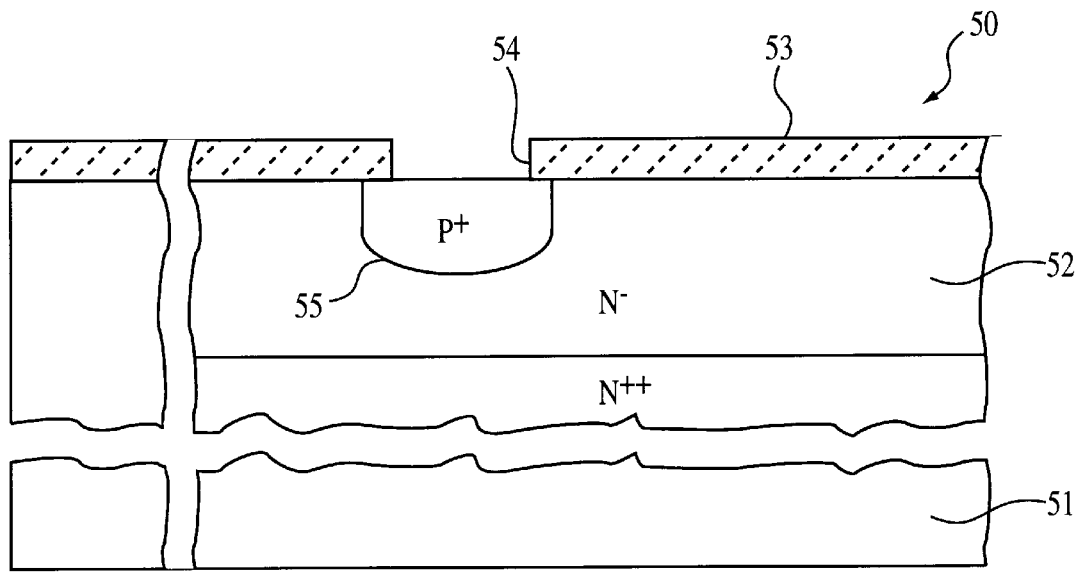
FIG. 2 is a cross-section of the termination region of the die of FIG. 1 in circled area "A" in FIG. 1 at a first stage of the manufacture of the device.

The first step of the process used to make the device of the invention is the selection of a suitable wafer 50, shown in FIG. 2 which has a highly conductive $N^{++}$ body 51, which may be 375 microns thick (ground down to about 200 microns at the end of the process) and which has an epitaxially formed junction-receiving substrate 52. For a breakdown voltage of about 30 volts, the layer 52 will have a thickness of about 5 microns and a resistivity of about 0.18 $\Omega$cm, which can be considered to be an $N^-$ layer.

A 7500 Å thick field oxide layer 53 is first grown atop layer 52 and, in a first mask step, a window 54 is opened in the field oxide and a $P^+$ diffusion 55 is formed around the periphery of and under the gate bonding pad of the chip, which will serve as a field termination ring for the final device. This diffusion may be carried out with a boron implant at a dose of 1E14 and at an energy of 80 kV, followed by a diffusion drive at 1050° C. for 2 hours. This will produce the $P^+$ region 55 with a depth of about 1.5 microns.

Figure 3:
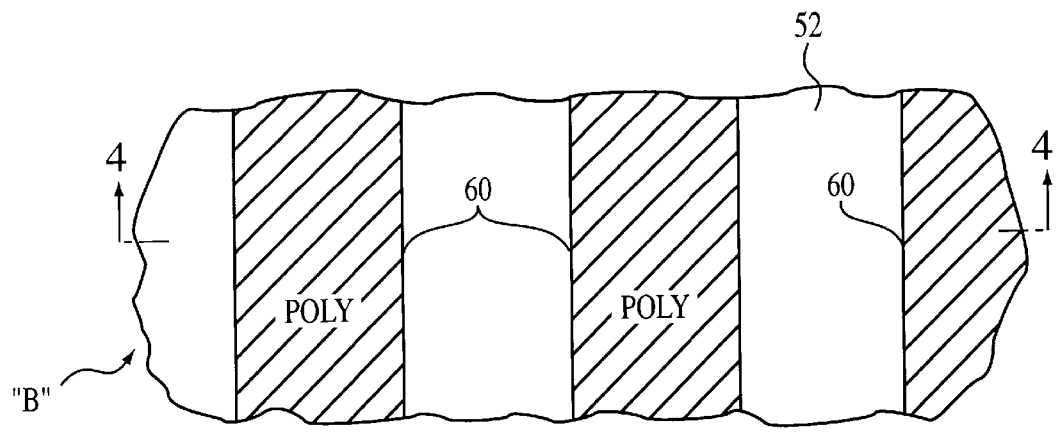
FIG. 3 shows the stripe pattern of the polysilicon gate within the active area portion shown in circle "B" in FIG. 1.
Figure 4:
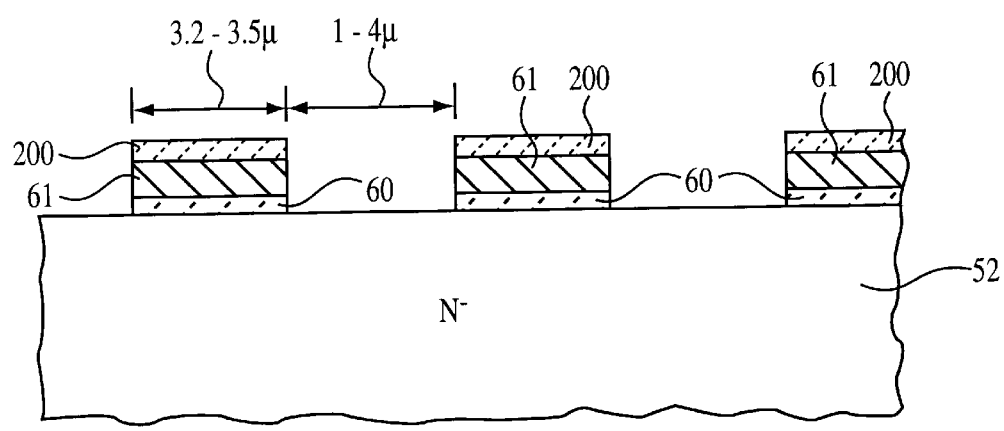
FIG. 4 is a cross-section of FIG. 3 taken across section line 4—4 in FIG. 3 after the step of forming the polysilicon gate stripes.

The field oxide 53 is then selectively etched to open the active area of the die. As next shown in FIGS. 3 and 4, a gate oxide layer 60 is grown over the surface of the layer 52 to a thickness of about 300 Å. A conductive polysilicon layer 61 is then grown atop oxide layer 60 to a thickness of about 0.75 micron. An oxide layer 200 is also grown or deposited atop the polysilicon layer 61. The polysilicon layer 61, oxide layer 60 and oxide layer 200 are then etched into elongated, parallel stripes as shown in FIG. 3.

In accordance with the invention, the width of the polysilicon strips 61 (the polyline width) is from 2.6 to 8.0 microns, preferably, 3.2 to 3.5 microns, and, for a 30 volt device, is preferably 3.4 microns, while the spacing between the parallel elongated and straight strips 61 is from 1 to 4 microns, preferably 1.5 microns.

Figure 5:
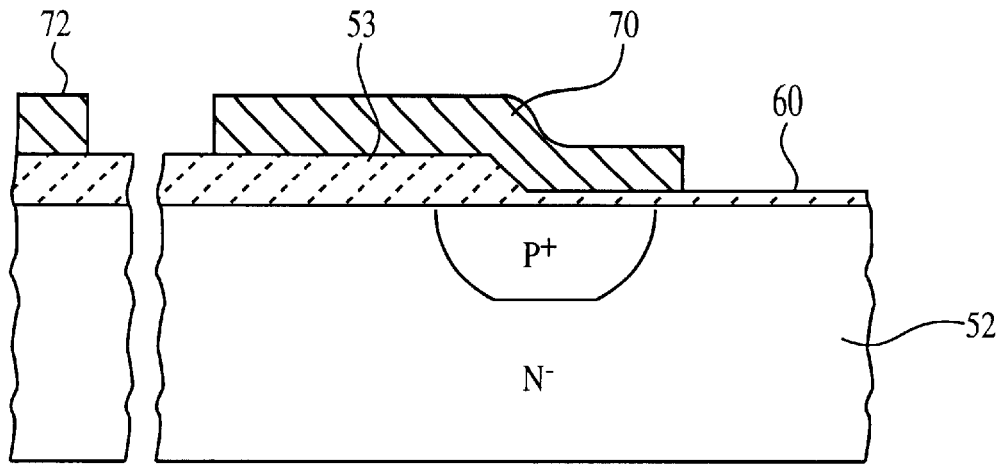
FIG. 5 shows the termination region of FIG. 2 after the deposition of polysilicon to form a termination field plate.

During the etch of polysilicon layer 61, the mask used permits the definition of the termination field plate 70 shown in FIG. 5. The field plate 70 has a length of about 15 microns, and is spaced from the adjacent end of EQR ring 72 (partially shown in FIG. 5) by a gap of 5 to 8 microns.

Figure 6:
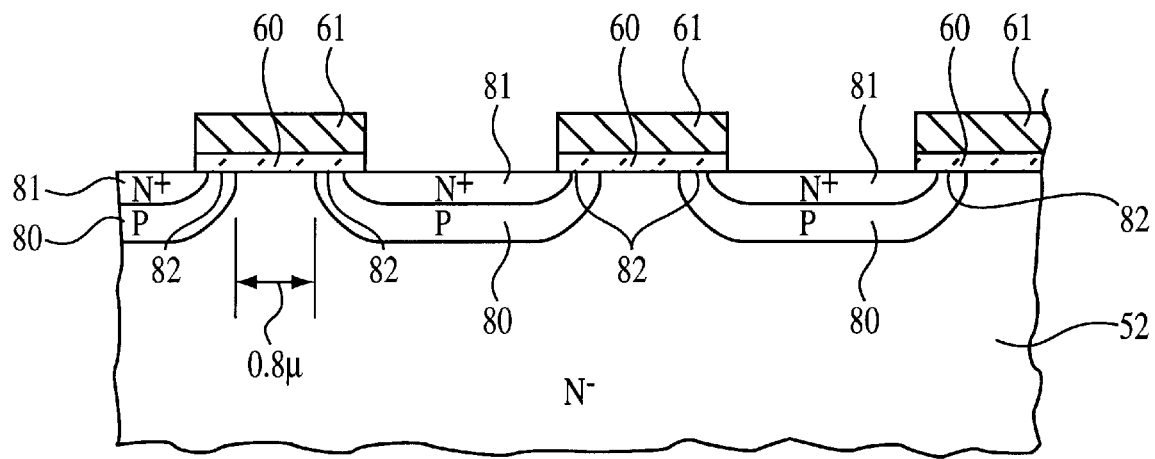
FIG. 6 shows the structure of FIG. 4 after the diffusion of channel and source regions.

Thereafter, and as shown in FIG. 6, a suitable photolithography step is carried out using oxide strips 200 and polysilicon stripes 61 to define elongated channel and source diffusions 80 and 81 respectively. More specifically, to form channel region 80, a boron implant is used at a dose of 8.5E13 at 80 kV. This implant is then driven at 1125° C. for 90 minutes in nitrogen gas, driving the channel implants 80 to a depth of about 1.25 microns. Significantly, the channels 80 are spaced by a common conduction region which is about 0.8 microns wide or greater as shown in FIG. 6.

The $N^+$ source regions 81 are then formed using an arsenic implant at a dose of 8E15 at 120 kV. This implant is then driven at 975° C. for 90 minutes, driving the source regions to a depth of about 0.4 microns, and forming invertible channel regions 82 within bases 80. As an inevitable result, the source regions are coextensive with the base stripes and are similarly formed as parallel elongated and straight stripes.

Figure 7:
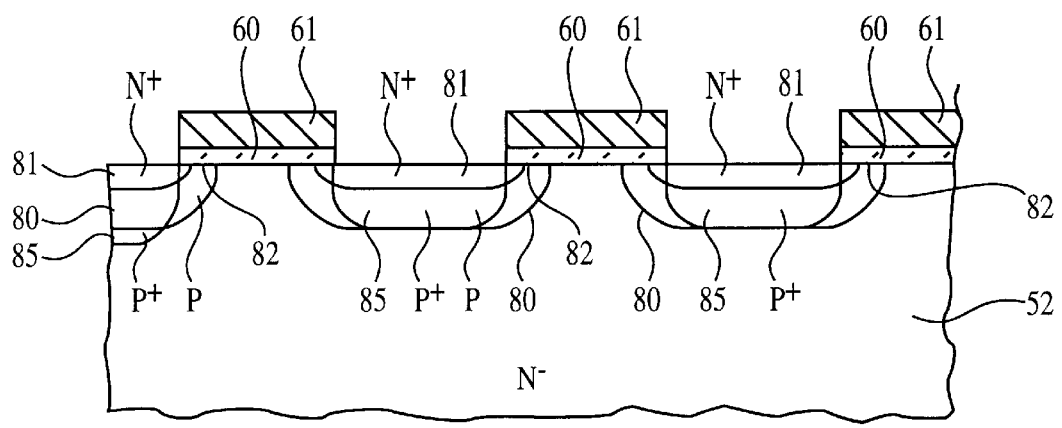
FIG. 7 shows the structure of FIG. 6 after the implant of high concentration deep base regions.

Thereafter, and as shown in FIG. 7, and in accordance with a separate feature of the invention, a $P^+$ region 85 is implanted through the same windows which defined the channel and source regions 80 and 81 respectively. To prevent the invasion of channel region 82 by the heavily doped regions 85, the regions are formed by a boron implant at a dose of 2E15 at 150 kV followed by an anneal of 30 minutes at 975° C. The $P^+$ regions 85 increase the ruggedness of the device and reduce the $R_{b'}$ of the bases 80.

Figure 8:
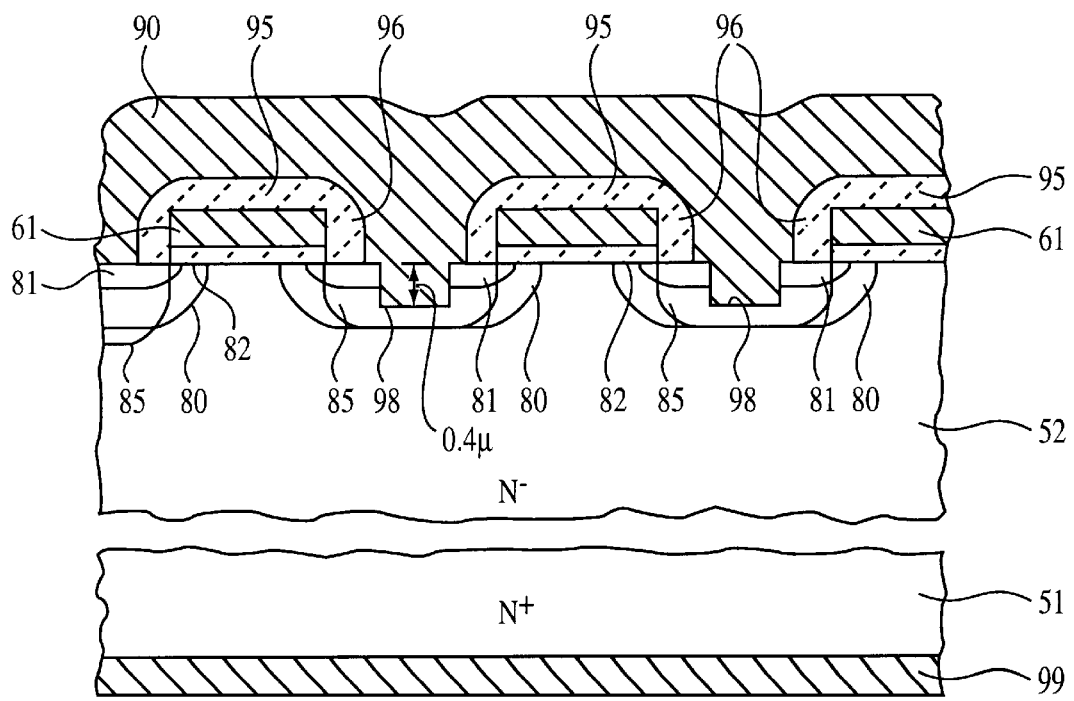
FIG. 8 shows the structure of FIG. 7 after the formation of source and drain electrodes.

Thereafter, the source aluminum contact 90 (FIG. 8) is connected to the source and channel regions by the process described in copending application Ser. No. 08/956,062 (IR-1232). Thus, as shown in FIG. 8, an insulation layer 95, consisting, for example of a low temperature oxide and having side wall spacers 96 are formed over the polysilicon stripes 61 to insulate them from the source contact 90. The layer 95 may have a thickness of about 0.6 to 0.7 microns. An etch operation is then carried out to etch shallow trenches 98 in and through and along the center of each source region 81 and into the underlying channel region 80. The trenches are preferably narrower than the space between side wall spacers to expose a short planar ledge at the silicon surface to improve the contact to the aluminum source layer 90.

The contact 90 may then receive an insulation coating (not shown) and may be patterned to enable the etching and definition of the gate pad 41 and the termination as desired.

A bottom metal 99 is then applied to the bottom of the chip to act as the drain contact.

Figure 9:
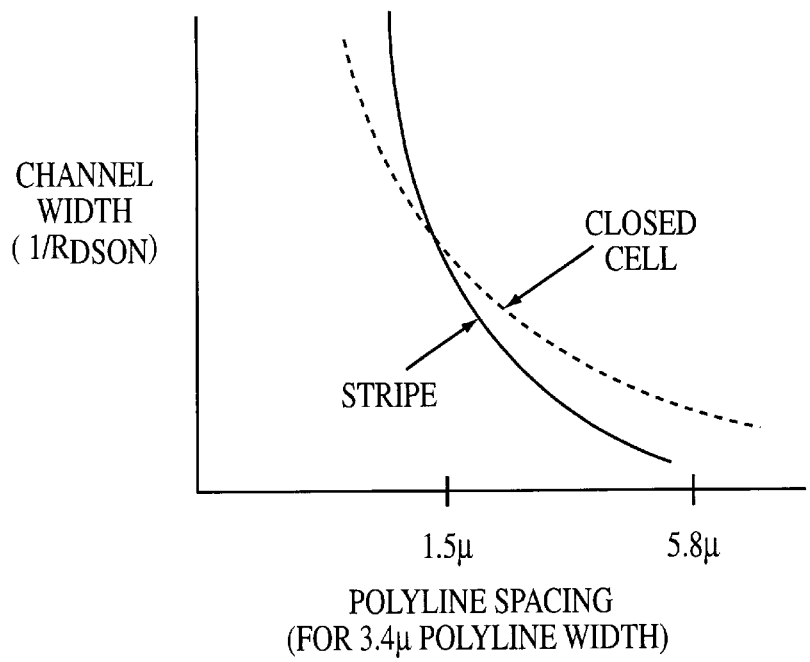
FIG. 9 shows the variation of channel width (and thus the reciprocal of on-resistance) as a function of polysilicon line spacing.
Figure 10:
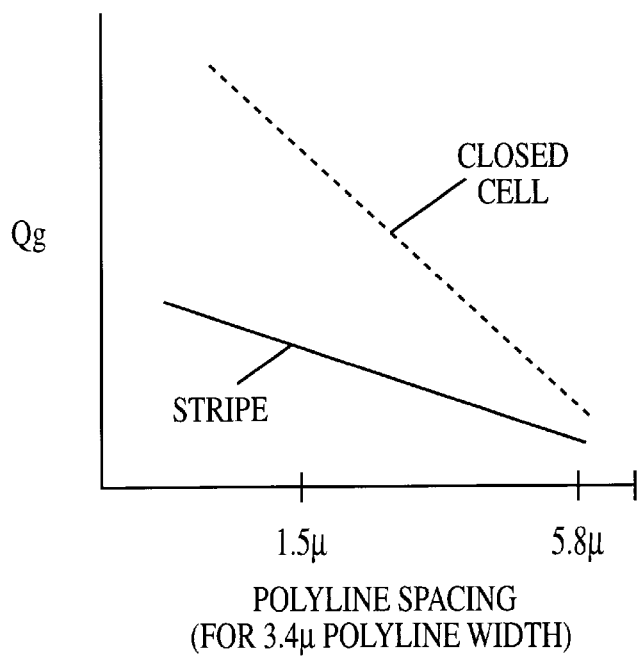
FIG. 10 shows the gate/drain area, and thus $Q_G$ as a function of polysilicon line spacing.
Figure 12:
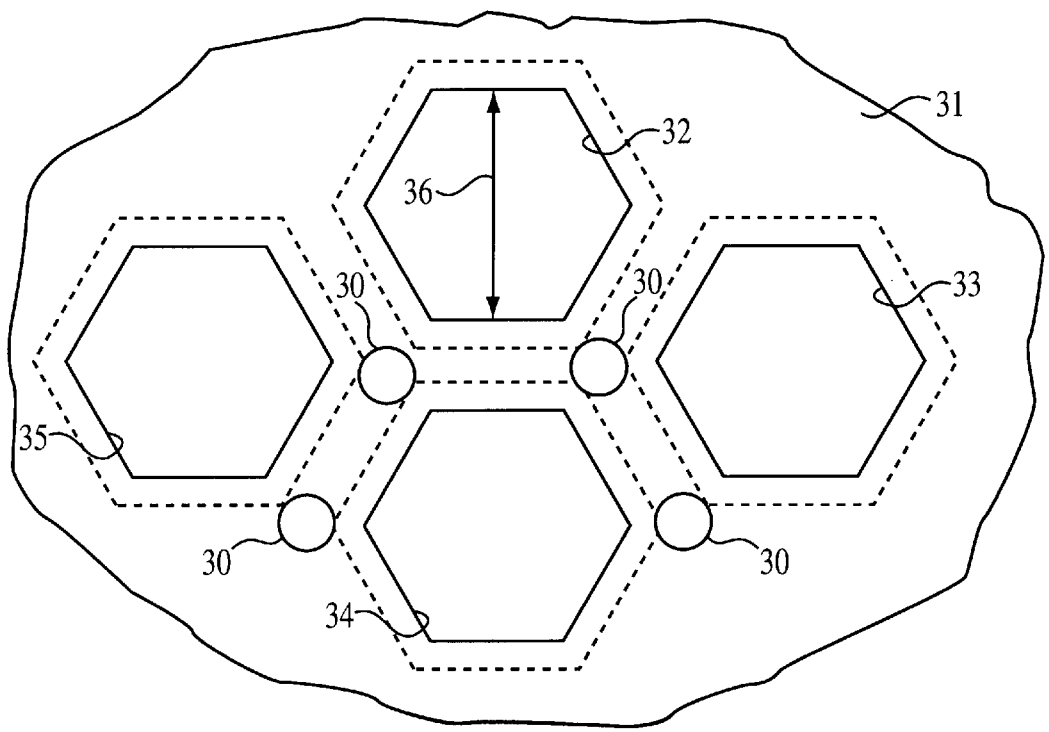
FIG. 12 shows the polysilicon layout of a prior art MOSFET with a polygonal cell topology

FIGS. 9 and 10 show the design trade-offs which are employed in the present invention, comparing the stripe topology of the present invention to known cellular topology. Referring to FIG. 9, it can be seen that the total channel width of a chip of given area increases as the polyline spacing is decreased. A larger channel width is desired because it reduces the on-resistance of the device. In the prior art hexagonal cell device of FIG. 12, a line spacing of 5.8 microns is used for lower voltage devices. As shown in FIG. 9, this yields a larger channel width than a stripe geometry with similar spacing. FIG. 10 shows the known advantage of the stripe geometry over the cellular in terms of $Q_g$. The difference in $Q_g$, however, is minimized at larger polyline spacings.

It has been found that the stripe geometry will produce a larger channel width per unit area for polyline spacings in the region between about 1 to 4 microns, particularly at about 1.5 microns, surprisingly with no increase of $R_{DSON}$.

Thus, in accordance with the invention, it has been found that a minimum figure of merit is obtained with a choice of a polyline spacing of from 1 to 4 microns and a polyline width of from 3.2 to 3.4 microns.

Figure 11:
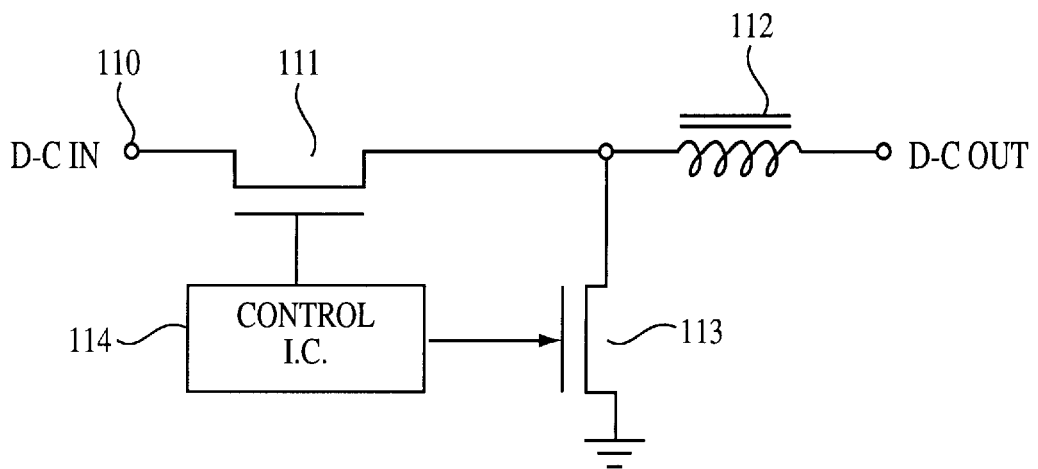
FIG. 11 shows a circuit diagram of a d-c to d-c converter using power MOSFETs made in accordance with the invention.

FIG. 11 shows a circuit diagram employing power MOSFETs made in accordance with the invention. Thus, the circuit of FIG. 11 is a d-c to d-c buck converter circuit comprising an input d-c terminal 110, which may be a nominally 14 volt battery connected to the source of a high frequency control MOSFET 111 and in series with an inductor 112 to a d-c output terminal which can, for example, be at a regulated 1.5 volts. A synchronous rectifier MOSFET 113 is connected from the node between MOSFET 111 and inductor 112 to ground. A suitable control integrated circuit 114 is programmed to produce gate signals to control the turn on and turn off of MOSFETs 111 and 113 in a suitable and known sequence to produce the desired output d-c voltage even though the input d-c voltage fluctuates as due to aging of an input battery, temperature changes, state of charge and the like.

In the past, MOSFET 111 was chosen to have a minimum switching loss while the synchronous rectifier MOSFET was chosen for low conduction loss (that is, low $R_{DSON}$). Thus, the MOSFETs had different manufacturing techniques, for example, a trench technology for MOSFET 111 and a planar cellular technology for MOSFET 113.

In accordance with an important feature of this invention, both MOSFETs 111 and 113 can advantageously employ the planar stripe technology shown for the device of FIGS. 1 and 8, and the die would differ only in size. Thus, MOSFET 111 has lower current requirements than MOSFET 113 and needs a die size, for example, of 56 mil by 140 mil. MOSFET 113 can have a die size of 102 mil by 157 mil; both die separately housed in SO8 style packages or copacked if desired.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated semiconductor device having a minimized figure of merit; said device comprising:
    a die of monocrystaline silicon having a body region and an upper junction receiving layer of one conductivity type;
    a plurality of elongated spaced and parallel base stripe diffusions of the other conductivity type formed in the upper surface of said junction receiving layer and a plurality of elongated source diffusions of the one conductivity type in and extending coextensively with said base stripe diffusions to define invertible channel regions along the sides of each of said elongated base stripe diffusions;
    said base stripe diffusions being substantially linear and having a substantially constant width;
    a plurality of gate stripes each comprising gate oxide stripes covered by conductive polysilicon stripes; said plurality of gate stripes overlying respective spaced pairs of adjacent invertable channel regions and the space between their respective base diffusions; said polysilicon stripes each having a substantially constant width in the range of about 3.2 microns to 3.5 microns and a spacing in the range of about 1.0 to 4.0 microns;
    adjacent ones of said base diffusions being spaced apart by greater then about 0.8 micron; and
    a plurality of source regions, said source regions extending coextensively with said base stripe diffusions and being substantially linear and having a substantially constant width.

2. The device of claim 1 wherein said polysilicon stripes have a width of about 3.1 microns and a spacing of about 1.5 microns.

3. The device of claim 2 wherein said base diffusion have a depth of about 1.25 microns and said source diffusions have a depth of about 0.4 microns.

4. The device of claim 2 which further includes a plurality of second base diffusions of the other conductivity type which are centered on respective ones of said base diffusions and which have a higher concentration then that of said base diffusions and which have a lateral extent defined by the spacing of said polysilicon stripes.

5. The device of claim 1 wherein said base diffusion have a depth of about 1.25 microns and said source diffusions have a depth of about 0.4 microns.

6. The device of claim 1 which further includes a plurality of second base diffusions of the other conductivity type which are centered on respective ones of said base diffusions and which have a higher concentration then that of said base diffusions and which have a lateral extent defined by the spacing of said polysilicon stripes.

7. The device of claim 5 which further includes a plurality of second base diffusions of the other conductivity type which are centered on respective ones of said base diffusions and which have a higher concentration then that of said base diffusions and which have a lateral extent defined by the spacing of said polysilicon stripes.

8. A MOSgated semiconductor device having a minimized figure of merit; said device comprising:
    a die of monocrystaline silicon having a body region and an upper junction receiving layer of one conductivity type;
    a plurality of elongated spaced and parallel base stripe diffusions of the other conductivity type formed in the upper surface of said junction receiving layer and a plurality of elongated source diffusions of the one conductivity type in and extending coextensively with said base stripe diffusions to define invertible channel regions along the sides of each of said elongated base stripe diffusions;
    said base stripe diffusions being substantially linear and having a substantially constant width;
    a plurality of gate stripes each comprising gate oxide stripes covered by conductive polysilicon stripes; said plurality of gate stripes overlying respective spaced pairs of adjacent invertable channel regions and the space between their respective base diffusions;
    a plurality of second base diffusions of the other conductivity type which are centered on respective ones of said base diffusions and which have a higher concentration then that of said base diffusions and which have a lateral extent defined by the spacing of said polysilicon stripes; and
    a plurality of source regions, said source regions extending coextensively with said base stripe diffusions and being substantially linear and having a substantially constant width.

9. The circuit wherein said identical topologies for each of said control MOSFET and synchronous rectifier MOSFET comprises, for each die:
    a die of monocrystaline silicon having a body region and an upper junction receiving layer of one conductivity type;
    a plurality of elongated spaced and parallel base stripe diffusions of the other conductivity type formed in the upper surface of said junction receiving layer and a plurality of elongated source diffusions of the one conductivity in and extending coextensively with said base stripe diffusions to define invertible channel regions along the sides of each of said elongated base stripe diffusions;
    said base stripe diffusions being substantially linear and having a substantially constant width;
    a plurality of gate stripes each comprising gate oxide stripes covered by conductive polysilicon stripes; said plurality of gate stripes overlying respective spaced pairs of adjacent invertable channel regions and the space between their respective base diffusions; said polysilicon stripes each having a substantially constant width in the range of about 3.2 microns to 3.5 microns and a spacing in the range of about 1.0 to 4.0 microns;

adjacent ones of said base diffusions being spaced apart by greater then about 0.8 micron; and a plurality of source regions, said source regions extending coextensively with said base stripe diffusions and being substantially linear and having a substantially constant width.

10. The circuit of claim 9, wherein said polysilicon stripes have a width of about 3.1 microns and a spacing of about 1.5 microns.

11. The circuit of claim 10, wherein said base diffusion have a depth of about 1.25 microns and said source diffusions have a depth of about 0.4 microns.

12. The circuit of claim 9 which further includes a plurality second base diffusions of the other conductivity type which are centered on respective ones of said base diffusions and which have a higher concentration then that of said base diffusions and a depth which is greater than that of said base diffusions and which has a lateral extent defined by the spacing of said polysilicon stripes.

\* \* \* \* \*